(12) United States Patent
Song et al.

(10) Patent No.: US 11,456,334 B2
(45) Date of Patent: Sep. 27, 2022

(54) SEMICONDUCTOR DEVICE INCLUDING DATA STORAGE PATTERN

(71) Applicant: SAMSUNG ELECTRONICS CO., LTD., Suwon-si (KR)

(72) Inventors: Si Ho Song, Suwon-si (KR); Ye Ro Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 374 days.

(21) Appl. No.: 16/425,095

(22) Filed: May 29, 2019

(65) Prior Publication Data
US 2020/0111839 A1 Apr. 9, 2020

(30) Foreign Application Priority Data

Oct. 5, 2018 (KR) .......................... 10-2018-0118975

(51) Int. Cl.
*H01L 27/24* (2006.01)
*H01L 45/00* (2006.01)

(52) U.S. Cl.
CPC ...... *H01L 27/2481* (2013.01); *H01L 27/2427* (2013.01); *H01L 45/126* (2013.01); *H01L 45/06* (2013.01); *H01L 45/1233* (2013.01)

(58) Field of Classification Search
CPC ......... H01L 45/04; H01L 45/06; H01L 45/12; H01L 45/1253; H01L 45/126; H01L 45/1273; H01L 45/1266; H01L 27/2427; H01L 27/2481
See application file for complete search history.

(56) References Cited

U.S. PATENT DOCUMENTS

| | | | |
|---|---|---|---|
| 6,927,410 B2 | 8/2005 | Chen | |
| 7,704,788 B2 | 4/2010 | Youn et al. | |
| 8,101,937 B2* | 1/2012 | Chiang | G11C 13/0007 257/2 |
| 8,119,478 B2* | 2/2012 | Jeong | H01L 45/06 438/257 |
| 9,490,426 B2 | 11/2016 | Shepard et al. | |
| 9,564,585 B1 | 2/2017 | Lille et al. | |
| 9,607,691 B1 | 3/2017 | Allegra et al. | |

(Continued)

FOREIGN PATENT DOCUMENTS

| KR | 10-2005-0059855 A | 6/2005 |
|---|---|---|
| KR | 10-0687757 B1 | 2/2007 |
| KR | 10-1447813 B1 | 10/2014 |

*Primary Examiner* — Sue A Purvis
*Assistant Examiner* — Scott Stowe
(74) *Attorney, Agent, or Firm* — Sughrue Mion, PLLC

(57) ABSTRACT

A semiconductor device including a data storage pattern is provided. The semiconductor device includes: specific resistivities a first conductive line disposed on a substrate and extending in a first direction; a second conductive line disposed above the first metal wiring; a plurality of variable resistance structures each of which includes a plurality of electrodes and a plurality of variable resistance patterns alternately stacked between the first metal wiring and the second metal wiring, wherein the plurality of variable resistance patterns are formed of a variable resistance material having a same composition, and the plurality of electrodes have different material characteristics such as different specific resistivities.

13 Claims, 8 Drawing Sheets

(56) References Cited

U.S. PATENT DOCUMENTS

2006/0278900 A1* 12/2006 Chang ................ H01L 27/2427
　　　　　　　　　　　　　　　　　　　　　　257/248
2008/0191188 A1　　8/2008　Jeong
2010/0093130 A1　　4/2010　Oh et al.
2011/0155993 A1　　6/2011　Chen
2013/0294154 A1　11/2013　Kang

* cited by examiner

SEMICONDUCTOR DEVICE INCLUDING DATA STORAGE PATTERN

CROSS-REFERENCE TO THE RELATED APPLICATION(S)

This application claims priority from Korean Patent Application No. 10-2018-0118975 filed on Oct. 5, 2018 in the Korean Intellectual Property Office, the disclosure of which is incorporated herein by reference in its entirety.

BACKGROUND

1. Field

Example embodiments of the present inventive concept relate to a semiconductor device, and more particularly, to a semiconductor device including a data storage pattern.

2. Description of Related Art

According to high performance and low power consumption of semiconductor devices such as memory devices and the like, next-generation memory devices such as phase-change random access memory (PRAM), resistive random-access memory RRAM and the like have been developed. Such next-generation memory devices may have resistance values changed according to current or voltage, and are formed using a data storage material capable of maintaining a resistance value, even when a current or voltage supply is interrupted. Memory devices including memory cells arranged in a three-dimensional structure have been developed to increase the degree of integration of next-generation memory devices.

SUMMARY

Various example embodiments of the present inventive concept provide a semiconductor device including a data storage pattern.

The embodiments provide a semiconductor device capable of easily implementing a multilevel cell while improving a degree of integration.

According to example embodiments, there is provided a semiconductor device which may include: a first conductive line disposed on a substrate and extending in a first direction; a second conductive line disposed on the first conductive line and extending in a second direction; and a first data storage structure disposed between the first conductive line and the second conductive line. The first data storage structure may include a first electrode, a first data storage pattern, a second electrode, a second data storage pattern, a third electrode, a third data storage pattern, a fourth electrode, a fourth data storage pattern, and a fifth electrode, stacked sequentially. The first electrode, the second electrode, the third electrode, the fourth electrode, and the fifth electrode may have different specific resistivities.

According to example embodiments, there is provided a semiconductor device which may include: a first metal wiring disposed on a substrate and extending in a first direction, a second metal wiring disposed above the first metal wiring and extending in a second direction different from the first direction, and a first data storage structure between the first metal wiring and the second metal wiring and including a first electrode, a first data storage pattern, a second electrode, a second data storage pattern, and a third electrode, stacked sequentially, wherein the first electrode, the second electrode, and the third electrode comprise silicon and have different silicon contents.

According to example embodiments, there is provided a semiconductor device which may include: a first metal wiring disposed on a substrate and extending in a first direction, a second metal wiring disposed above the first metal wiring and extending in a second direction different from the first direction, and a first data storage structure between the first metal wiring and the second metal wiring and including a first electrode, a first data storage pattern, a second electrode, a second data storage pattern, a third electrode, a third data storage pattern, a fourth electrode, a fourth data storage pattern, and a fifth electrode, stacked sequentially, wherein the first electrode, the second electrode, the third electrode, the fourth electrode, and the fifth electrode comprise silicon, and a silicon content of the first electrode is lower than a silicon content of the fifth electrode and greater than a silicon content of the third electrode.

BRIEF DESCRIPTION OF DRAWINGS

The above and other aspects will be more clearly understood from the following detailed description, taken in conjunction with the accompanying drawings, in which.

DETAILED DESCRIPTION

The embodiments of the inventive concepts described herebelow are all exemplary, and thus, the inventive concepts are not limited to these embodiments disclosed below, and may be realized in various other forms of embodiment.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1:
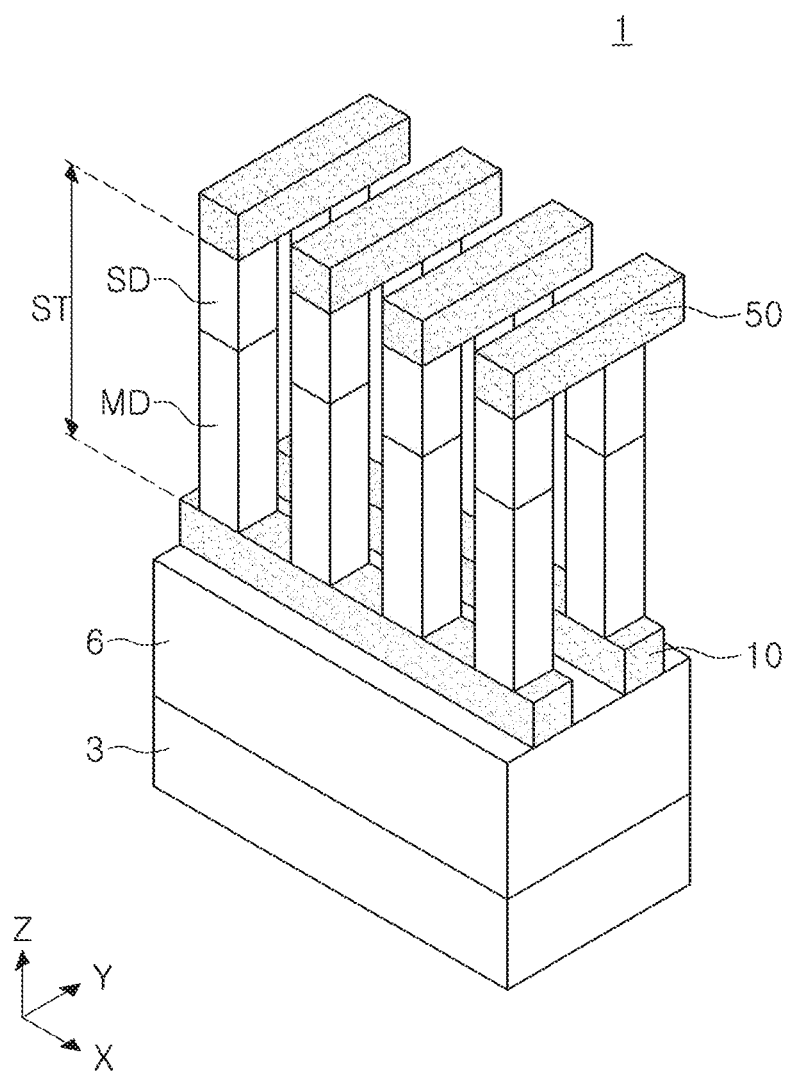
FIG. 1 is a perspective view illustrating a semiconductor device according to an example embodiment.
Figure 2:
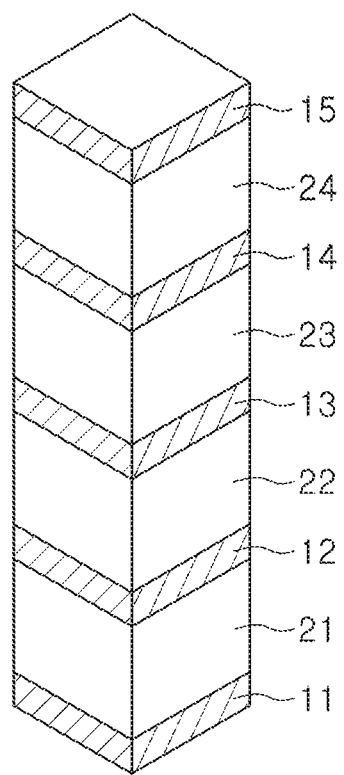
FIGS. 2 and 3 are views illustrating portions of components of a semiconductor device according to example embodiments.

FIG. 1 is a perspective view illustrating a semiconductor device 1 according to an embodiment. FIG. 2 is a view illustrating a data storage structure MD of the semiconductor device 1, and FIG. 3 is a view illustrating a selector structure SD of the semiconductor device 1.

Figure 3:
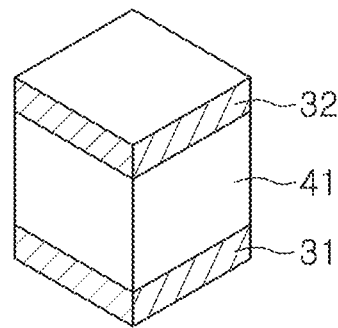

Referring to FIGS. 1, 2 and 3, the semiconductor device 1 may include a memory region ST above a substrate 3. The semiconductor device 1 may include a first conductive line 10 between the substrate 3 and the memory region ST, and a second conductive line 50 on the memory region ST. The substrate 3 may be a semiconductor substrate which may be formed of a semiconductor material such as silicon (Si) or the like.

The first conductive line 10 may be disposed on a base insulating layer 6 on the substrate 3, and may have a linear shape extending in a first direction X, parallel to a surface of the substrate 3. The base insulating layer 6 may be formed of an insulating material such as silicon oxide or the like. The second conductive line 50 may have a linear shape parallel to the surface of the substrate 3 and extending in a second direction Y, perpendicular to the first direction X. The first conductive line 10 may be referred to as a first metal line, and the second conductive line 50 may be referred to as a second metal line.

The semiconductor device 1 may have a structure in which a peripheral circuit region is disposed below the memory region ST. On the substrate 3, circuit transistors and circuit wirings constituting peripheral circuits may be disposed. The base insulating layer 6 may cover the circuit transistors and the circuit wirings.

The first conductive line 10 and the second conductive line 50 may be connected to the circuit wirings of the peripheral circuit region.

The first conductive lines 10 and the second conductive lines 50 may include a barrier layer and a conductive layer. The barrier layer may include a metal nitride such as TiN or the like, and the conductive layer may include a metal material such as tungsten or the like.

The memory region ST may include a data storage structure MD and a selector structure SD connected in series between the first conductive line 10 and the second conductive line 50. The data storage structure MD may be referred to as a variable resistance structure, and the selector structure SD may be referred to as a switch structure. The data storage structure MD and the selector structure SD may form a memory cell structure.

The data storage structures MD may be disposed on the first conductive lines 10, and the selector structures SD may be disposed on the data storage structures MD. The remaining spaces between the first conductive lines 10 and the second conductive lines 50 may be filled with an insulating material.

Each of the data storage structures MD may include a first electrode 11, a first data storage pattern 21, a second electrode 12, a second data storage pattern 22, a third electrode 13, a third data storage pattern 23, a fourth electrode 14, a fourth data storage pattern 24, and a fifth electrode 15, stacked sequentially. The first to fourth data storage patterns 21, 22, 23 and 24 may be referred to as first to fourth variable resistance patterns. The first to fifth electrodes 11, 12, 13, 14 and 15 may be referred to as first to fifth heaters.

For example, the data storage structures MD may have a quadrangular columnar shape. Alternatively, the data storage structures MD may have a cylindrical shape, an elliptical columnar shape, or a polygonal columnar shape. In the case of the data storage structures MD, the first electrode 11, the first data storage pattern 21, the second electrode 12, the second data storage pattern 22, the third electrode 13, the third data storage pattern 23, the fourth electrode 14, the fourth data storage pattern 24, and the fifth electrode 15 may have the same width or area. The first electrode 11, the first data storage pattern 21, the second electrode 12, the second data storage pattern 22, the third electrode 13, the third data storage pattern 23, the fourth electrode 14, the fourth data storage pattern 24, and the fifth electrode 15 may have side surfaces vertically aligned and coplanar with one another.

In an embodiment, the first to fourth data storage patterns 21, 22, 23 and 24 may be formed of a material capable of storing information using a resistance change. For example, the first to fourth data storage patterns 21, 22, 23 and 24 may be formed of a phase change memory material in which a phase may change from an amorphous phase having a high specific resistivity to a crystalline phase having a low specific resistivity or from the crystalline phase to the amorphous phase depending on heating temperature and time by an applied current. The phase change memory material may be a chalcogenide material including germanium (Ge), antimony (Sb) and/or tellurium (Te). The phase change memory material may be a material including at least one of Te and selenium (Se) and at least one of germanium (Ge), antimony (Sb), bismuth (Bi), lead (Pb), tin (Sn), arsenic (As), sulfur (S), silicon (Si), phosphorus (P), oxygen (O), nitrogen (N), and indium (In). The phase change memory material may also be provided an In—Sb—Te (IST) material, a Bi—Sb—Te (BST) material, or a superlattice material formed by repetitive lamination of GeTe—SbTe.

[31] The first to fourth data storage patterns 21, 22, 23 and 24 may include doped regions disposed adjacent to the first to fifth electrodes 11, 12, 13, 14 and 15. The doped regions may include boron (B), arsenic (As), or the like.

The first to fifth electrodes 11, 12, 13, 14 and 15 may be formed of conductive materials having different specific resistivities. The first to fifth electrodes 11, 12, 13, 14 and 15 may be formed of conductive materials having different work functions.

The first electrode 11 may have a first specific resistivity, the second electrode 12 may have a second specific resistivity, the third electrode 13 may have a third specific resistivity, the fourth electrode 14 may have a fourth specific resistivity, and the fifth electrode 15 may have a fifth specific resistivity.

In an example embodiment, among the first to fifth specific resistivities, the fifth specific resistivity may be a highest resistance and the second specific resistivity may be a lowest resistance. The first specific resistivity may be lower than the fifth specific resistivity and may be higher than the third specific resistivity, and the fourth specific resistivity may be lower than the third specific resistivity and may be higher than the second specific resistivity. In detail, the magnitude of specific resistivity may decrease in the order of the fifth specific resistivity, the first specific resistivity, the third specific resistivity, the fourth specific resistivity and the second specific resistivity. In other words, the specific resistivity may decrease in the order of the fifth electrode, the first electrode, the third electrode, the fourth electrode, and the second electrode. For example, the fifth specific resistivity of the fifth electrode 15 may be 7.6 to 9.4 mΩ·cm, the first specific resistivity of the first electrode 11 may be 6.1 to 7.6 mΩ·cm, the third specific resistivity of the third electrode 13 may be 2.3 to 3.1 mΩ·cm, the fourth specific resistivity of the fourth electrode 14 may be 1.7 to 2.2 mΩ·cm, the second specific resistivity of the second electrode 12 may be 1.0 to 1.3 mΩ·cm.

The first to fifth electrodes 11, 12, 13, 14 and 15 may be formed of a conductive material including TiN, TiAlN, TaN, WN, MoN, TiSiN, TiBN, ZrSiN, WSiN, WBN, ZrAlN, MoAlN, TaSiN, TaAlN, TiON, TiAlON, WON, TaON, or combinations thereof, and/or a carbon-based conductive material. In this case, the carbon-based conductive material may be a material including C, CN, TiCN, TaCN, TiSiCN, or combinations thereof.

For example, the first to fifth electrodes 11, 12, 13, 14 and 15 may include titanium silicon nitride (TiSiN) containing different contents of silicon (Si). The first electrode 11 may include a first silicon content, the second electrode 12 may include a second silicon content, the third electrode 13 may include a third silicon content, the fourth electrode 14 may include a fourth silicon content, and the fifth electrode 15 may include a fifth silicon content. For example, among the first to fifth silicon contents, the fifth silicon content may be greatest, and the second silicon content may be lowest. The first silicon content may be lower than the fifth silicon content and may be greater than the third silicon content, and the fourth silicon content may be lower than the third silicon content and may be greater than the second silicon content. In detail, the fifth silicon content, the first silicon content, the third silicon content, the fourth silicon content, and the second silicon content may be reduced in order thereof. For example, the silicon content may decrease in the order of the fifth electrode, the first electrode, the third electrode, the fourth electrode, and the second electrode. For example, the fifth silicon content of the fifth electrode 15 may be 22.5 to 27.5 at %, the first silicon content of the first electrode 11 may be 19.8 to 24.2 at %, the third silicon content of the third electrode 13 may be 13.5 to 16.5 at %, the fourth silicon content of the fourth electrode 14 may be 11.7 to 14.3 at %, and the second silicon content of the second electrode 12 may be 9.9 to 12.1 at %.

[37] In an example embodiment, among the first to fifth specific resistivities, the first specific resistivity may be highest, and the fourth specific resistivity may be lowest. The fifth specific resistivity may be lower than the first specific resistivity and higher than the third specific resistivity, while the second specific resistivity may be lower than the third specific resistivity and higher than the fourth specific resistivity. In detail, the resistance magnitude may be reduced in the order of the first specific resistivity, the fifth specific resistivity, the third specific resistivity, the second specific resistivity and the fourth specific resistivity. For example, the specific resistivity may decrease in the order of the first electrode, the fifth electrode, the third electrode, the second electrode, and the fourth electrode. For example, the first specific resistivity of the first electrode 11 may be 7.6 to 9.4 mΩ·cm, the fifth specific resistivity of the fifth electrode 15 may be 6.1 to 7.6 mΩ·cm, the third specific resistivity of the third electrode 13 may be 2.3 to 3.1 mΩ·cm, the second specific resistivity of the second electrode 12 may be 1.7 to 2.2 mΩ·cm, and the fourth specific resistivity of the fourth electrode 14 may be 1.0 to 1.3 mΩ·cm.

In an example embodiment, among the first to fifth silicon contents, the first silicon content may be greatest, and the fourth silicon content may be lowest. The fifth silicon content may be lower than the first silicon content and greater than the third silicon content, while the second silicon content may be lower than the third silicon content and greater than the fourth silicon content. In detail, the first silicon content, the fifth silicon content, the third silicon content, the second silicon content, and the fourth silicon content may be reduced in order thereof. For example, the silicon content may decrease in the order of the first electrode, the fifth electrode, the third electrode, the second electrode, and the fourth electrode. For example, the first silicon content of the first electrode 11 may be 22.5 to 27.5 at %, the fifth silicon content of the fifth electrode 15 may be 19.8 to 24.2 at %, the third silicon content of the third electrode 13 may be 13.5 to 16.5 at %, the second silicon content of the second electrode 12 may be 11.7 to 14.3 at %, and the fourth silicon content of the fourth electrode 14 may be 9.9 to 12.1 at %.

Each of the data storage structures MD is illustrated as including five electrodes and four data storage patterns by way of example, but the embodiment thereof is not limited thereto.

Each of the selector structures SD may include a lower selective electrode 31, a selector 41, and an upper selective electrode 32, stacked sequentially. The lower selective electrode 31 may be referred to as a lower switching electrode, the selector 41 may be referred to as a switch, and the upper selective electrode 32 may be referred to as an upper switching electrode.

The selector structures SD may have, for example, a quadrangular columnar shape. Alternatively, the selector structures SD may have a cylindrical shape, an elliptical columnar shape, or a polygonal columnar shape. In the case of the selector structures SD, widths or areas of the lower selective electrode 31, the selector 41 and the upper selective electrode 32 may be the same as one another. Side surfaces of the lower selective electrode 31, the selector 41 and the upper selective electrode 32 may be vertically aligned and coplanar with one another.

The selectors 41 may be formed of a threshold switching material. For example, the selectors 41 may be formed of an ovonic threshold switching (OTS) material. The selector structures SD may be threshold switching devices.

The selectors 41 may be formed of a chalcogenide-based material different from a chalcogenide material that may be used for the first to fourth data storage patterns 21, 22, 23 and 24. For example, the first to fourth data storage patterns 21, 22, 23 and 24 may be formed of a phase-change memory material, such as an alloy of Ge, Sb, and/or Te, or the like, in which a phase may be shifted from a crystalline phase to an amorphous phase or from an amorphous phase to a crystalline phase, during operation of the semiconductor device 1, and the selectors 41 may be formed of a chalcogenide-based ovonic threshold switching (OTS) material capable of maintaining an amorphous phase during operation of the semiconductor device 1. The selectors 41 as described above may maintain an amorphous phase even when a voltage having a magnitude equal to or greater than a threshold voltage is applied and an off state thereof is thus switched to an on state.

The selectors 41 may be formed of an alloy material including at least two of As, S, Se, Te or Ge, and an additional element added to the alloy material, such as Si, N, or the like, capable of maintaining a non-crystalline phase at a relatively higher temperature. Alternatively, the selectors 41 may include any one alloy material among an alloy material including Te, As, Ge and Si, an alloy material including Ge, Te and Pb, an alloy material including Ge, Se and Te, an alloy material including Al, As and Te, an alloy material including Se, As, Ge and Si, an alloy material including Se, As, Ge and C, an alloy material including Se, Te, Ge and Si, an alloy material including Ge, Sb, Te and Se, an alloy material including Ge, Bi, Te and Se, an alloy material including Ge, As, Sb and Se, an alloy material including Ge, As, Bi and Te, or an alloy material including Ge, As, Bi and Se. The selectors 41 may be formed of a material including any one of AsTeGeSiIn, GeTe, SnTe, GeSe, SnSe, AsTeGeSiIn, AsTeGeSiSbS, AsTeGeSiIn, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGe-SiSeNS, AsTeGeSiIn, AsTeGeSiP, AsSe, AsGeSe, AsTeGeSe, AsTeGeSi, ZnTe, N-treatmented OTS, TeAsGeSi, GeTePb, GeSeTe, AlAsTe, SeAsGeSi, SeAsGeC, SeTeGeSi, GeSbTeSe, GeBiTeSe, GeAsSbSe, GeAsBiTe, GeAsBiSe, AsSe, AsSeGe, AsSeGeTe, AsGeTeSi, and $Ge_xSe_{1-x}$.

Each of the selector structures SD may further include an upper interface pattern disposed between the upper selective electrode 32 and the selector 41, and a lower interface pattern disposed between the lower selective electrode 31 and the selector 41. The upper interface pattern and the lower interface pattern may be formed of, for example, carbon.

In an example embodiment, the first conductive lines 10 may be word lines and the second conductive lines 50 may be bit lines. Alternatively, the first conductive lines 10 may be bit lines, and the second conductive lines 50 may be word lines.

Figure 4:
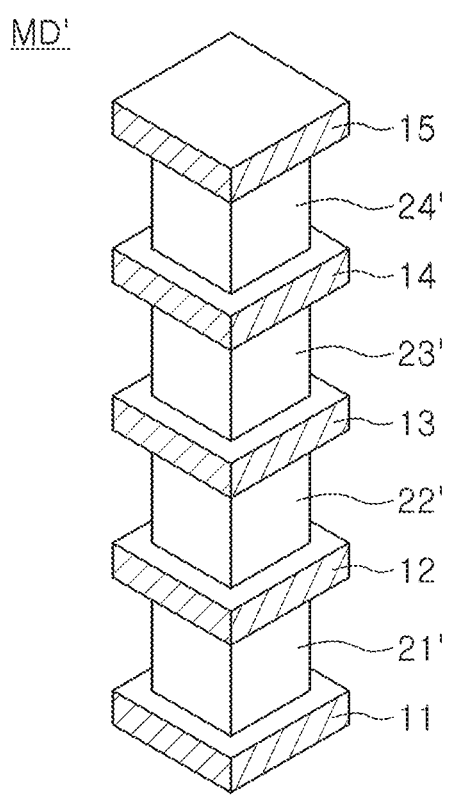
FIGS. 4 and 5 are views illustrating portions of components of a semiconductor device according to example embodiments.
Figure 5:
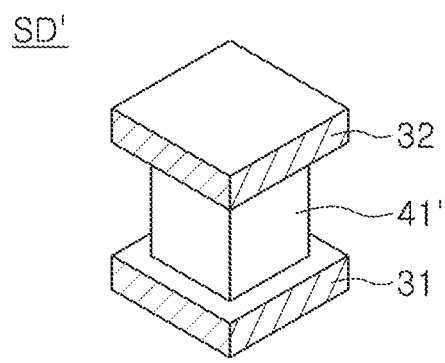

FIGS. 4 and 5 are views illustrating some components of a semiconductor device according to embodiments. FIGS. 4 and 5 are views illustrating modified examples of the data storage structure MD of FIG. 2 and the selector structure SD of FIG. 3.

Referring to FIGS. 4 and 5, the shapes of a data storage structure MD' and a selector structure SD' may be different from those of the data storage structure MD and the selector structure SD of FIGS. 2 and 3. Remaining parts, except for the shapes of the data storage structure MD' and the selector structure SD', may be the same as those of the data storage structure MD and the selector structure SD.

The data storage structure MD' may include a first electrode 11, a first data storage pattern 21', a second electrode 12, a second data storage pattern 22', a third electrode 13, a third data storage pattern 23', a fourth electrode 14, a fourth data storage pattern 24' and a fifth electrode 15, which are stacked sequentially. The first to fourth data storage patterns 21', 22', 23', and 24' may be referred to as first to fourth variable resistance patterns.

In the case of the data storage structure MD', side surfaces of the first electrode 11, side surfaces of the second electrode 12, side surfaces of the third electrode 13, side surfaces of the fourth electrode 14 and side surfaces of the fifth electrode 15 may protrude further than those of the first data storage pattern 21', the second data storage pattern 22', the third data storage pattern 23' and the fourth data storage pattern 24'.

The selector structure SD' may include a lower selective electrode 31, a selector 41' and an upper selective electrode 32, stacked sequentially. The lower selective electrode 31 may be referred to as a lower switching electrode, the selector 41' may be referred to as a switch, and the upper selective electrode 32 may be referred to as an upper switching electrode.

In the case of the selector structure SD', side surfaces of the lower selective electrode 31 and side surfaces of the upper selective electrode 32 may protrude further than side surfaces of the selector 41'.

Alternatively, in an embodiment, in the case of the data storage structure MD', the side surfaces of the first data storage pattern 21', the side surfaces of the second data storage pattern 22', the side surfaces of the third data storage pattern 23' and the side surfaces of the fourth data storage pattern 24' may protrude further than those of the first electrode 11, the second electrode 12, the third electrode 13, the fourth electrode 14, and the fifth electrode 15. In the case of the selector structure SD', the side surfaces of the selector 41' may protrude further than those of the lower selective electrode 31 and the upper selective electrode 32.

Figure 6:
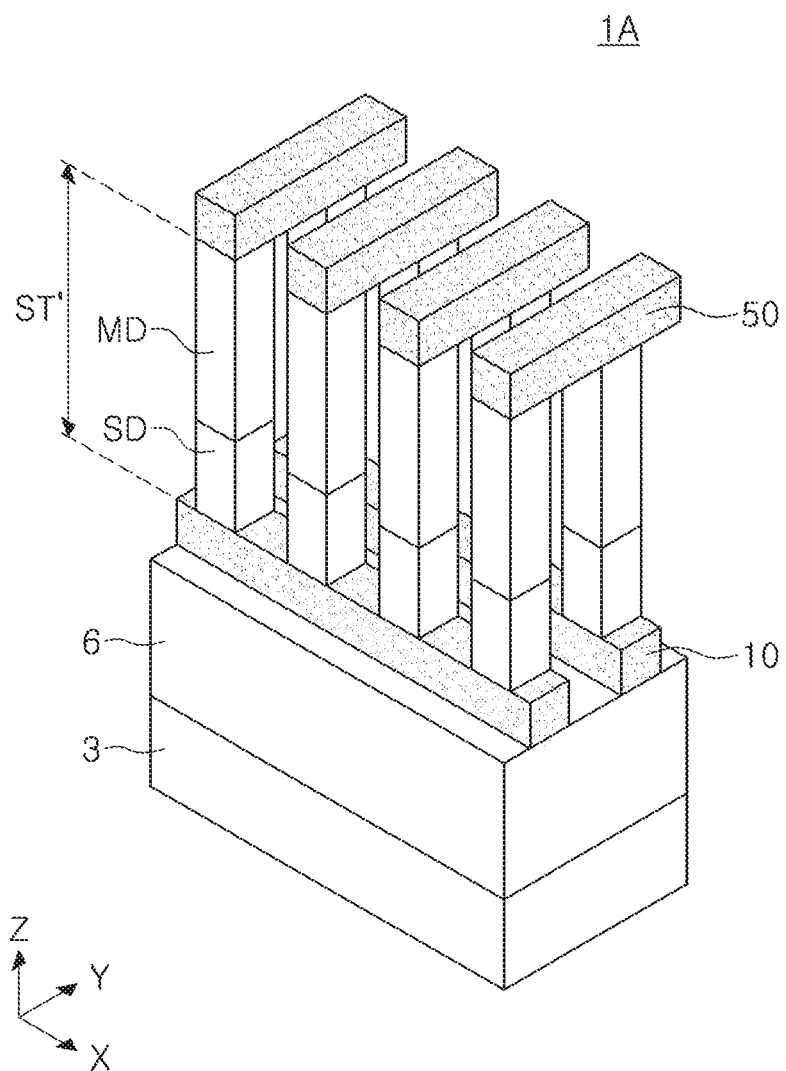
FIG. 6 is a perspective view illustrating a semiconductor device according to an example embodiment.

FIG. 6 is a perspective view illustrating a semiconductor device 1A according to an embodiment.

Referring to FIG. 6, a memory region ST' of the semiconductor device 1A may include an data storage structure MD and a selector structure SD, connected in series between the first conductive line 10 and the second conductive line 50.

In the case of the semiconductor device 1A, in a manner different from the semiconductor device 1 of FIG. 1, the selector structures SD may be disposed on the first conductive lines 10, and the data storage structures MD may be disposed on the selector structures SD.

Except for the positions of the selector structures SD and the data storage structures MD, the semiconductor device 1A is the same as the semiconductor device 1, and thus, repeated description will be omitted.

Figure 7:
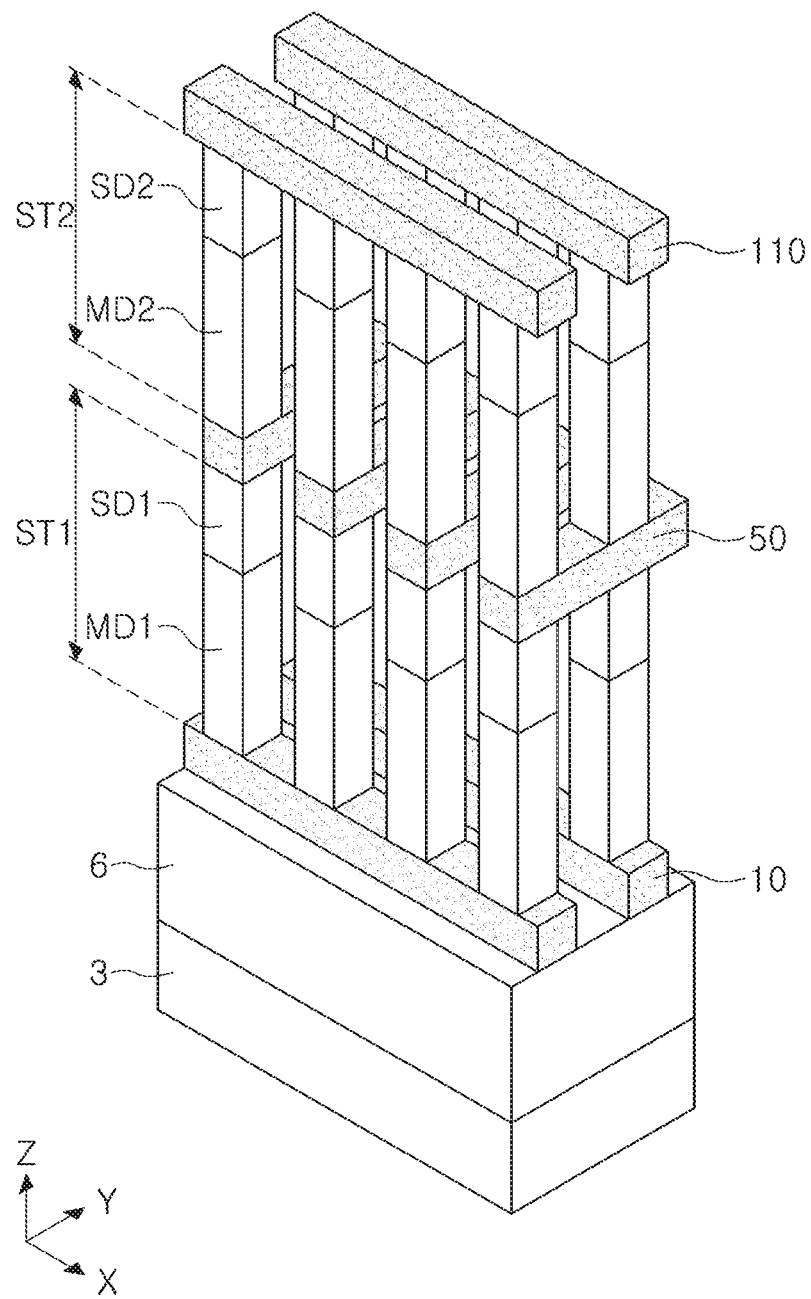
FIG. 7 is a perspective view illustrating a semiconductor device according to an example embodiment.

FIG. 7 is a perspective view illustrating a semiconductor device 1B according to an embodiment. Referring to FIG. 7, the semiconductor device 1B may include a first memory region ST1 and a second memory region ST2 stacked above a substrate 3. The semiconductor device 1B may include a first conductive line 10 between the substrate 3 and the first memory region ST1, a second conductive line 50 between the first memory region ST1 and the second memory region ST2, and a third conductive line 110 on the second memory region ST2.

The first conductive line 10 may be disposed on a base insulating layer 6 on the substrate 3, and may have a linear shape extending in a first direction X parallel to a surface of the substrate 3. The second conductive line 50 may have a linear shape parallel to the surface of the substrate 3 and extending in a second direction Y perpendicular to the first direction X. The third conductive line 110 may have a linear shape extending in the first direction X. The third conductive line 50 may be referred to as a third metal wiring.

The first memory region ST1 may include a first data storage structure MD1 and a first selector structure SD1 connected in series between the first conductive line 10 and the second conductive line 50. The first data storage structure MD1 may be disposed on the first conductive line 10, and the first selector structure SD1 may be disposed on the first data storage structure MD1. The second memory region ST2 may include a second data storage structure MD2 and a second selector structure SD2, connected in series between the second conductive line 50 and the third conductive line 110. The second data storage structure MD2 may be disposed on the second conductive line 50, and the second selector structure SD2 may be disposed on the second data storage structure MD2.

The first data storage structure MD1 and the second data storage structure MD2 may be the same as the data storage structure MD of FIG. 2, and may be modified to have the same structure as the data storage structure MD' of FIG. 4. The first data storage structure MD1 and the second data storage structure MD2 may include a first electrode 11, a first data storage pattern 21, a second electrode 12, a second data storage pattern 22, a third electrode 13, a third data storage pattern 23, a fourth electrode 14, a fourth data storage pattern 24, and a fifth electrode 15, stacked sequentially. In the second data storage structure MD2, the first electrode 11, the first data storage pattern 21, the second electrode 12, the second data storage pattern 22, the third electrode 13, the third data storage pattern 23, the fourth electrode 14, the fourth data storage pattern 24, and the fifth electrode 15 may be referred to as a sixth electrode, a sixth data storage pattern, a seventh electrode, a seventh data storage pattern, an eighth electrode, an eighth data storage pattern, a ninth electrode, a ninth data storage pattern, and a tenth electrode, respectively.

The first selector structure SD1 and the second selector structure SD2 may be the same as the selector structure SD of FIG. 3, and may be modified to have the same structure as that of the selector structure SD' of FIG. 5.

Figure 8:
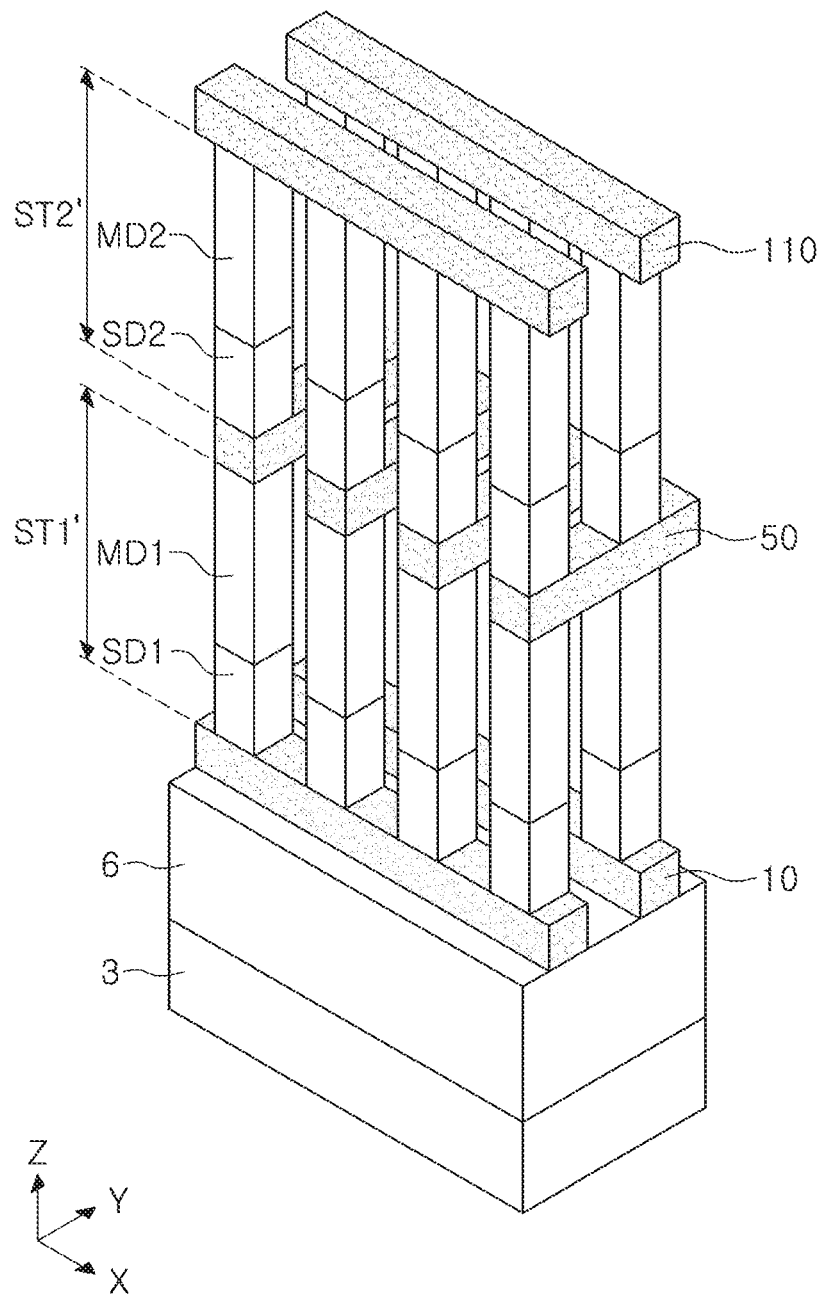
FIG. 8 is a perspective view illustrating a semiconductor device according to an example embodiment.

FIG. 8 is a perspective view illustrating a semiconductor device 1C according to an embodiment.

Referring to FIG. 8, the semiconductor device 1C may include a first memory region ST1' and a second memory region ST2', stacked on a substrate 3. The semiconductor device 1C may include a first conductive line 10 between the substrate 3 and the first memory region ST1', a second conductive line 50 between the first memory region ST1' and the second memory region ST2', and a third conductive line 110 on the second memory region ST2'.

In the case of the semiconductor device 1C, unlike the semiconductor device 1B of FIG. 7, first selector structures SD1 may first be disposed on the first conductive lines 10, and first data storage structures MD1 may be disposed on the first selector structures SD1. The second selector structures SD2 may first be disposed on the second conductive lines 50, and the second data storage structures MD2 may be disposed on the second selector structures SD2.

Figure 9:
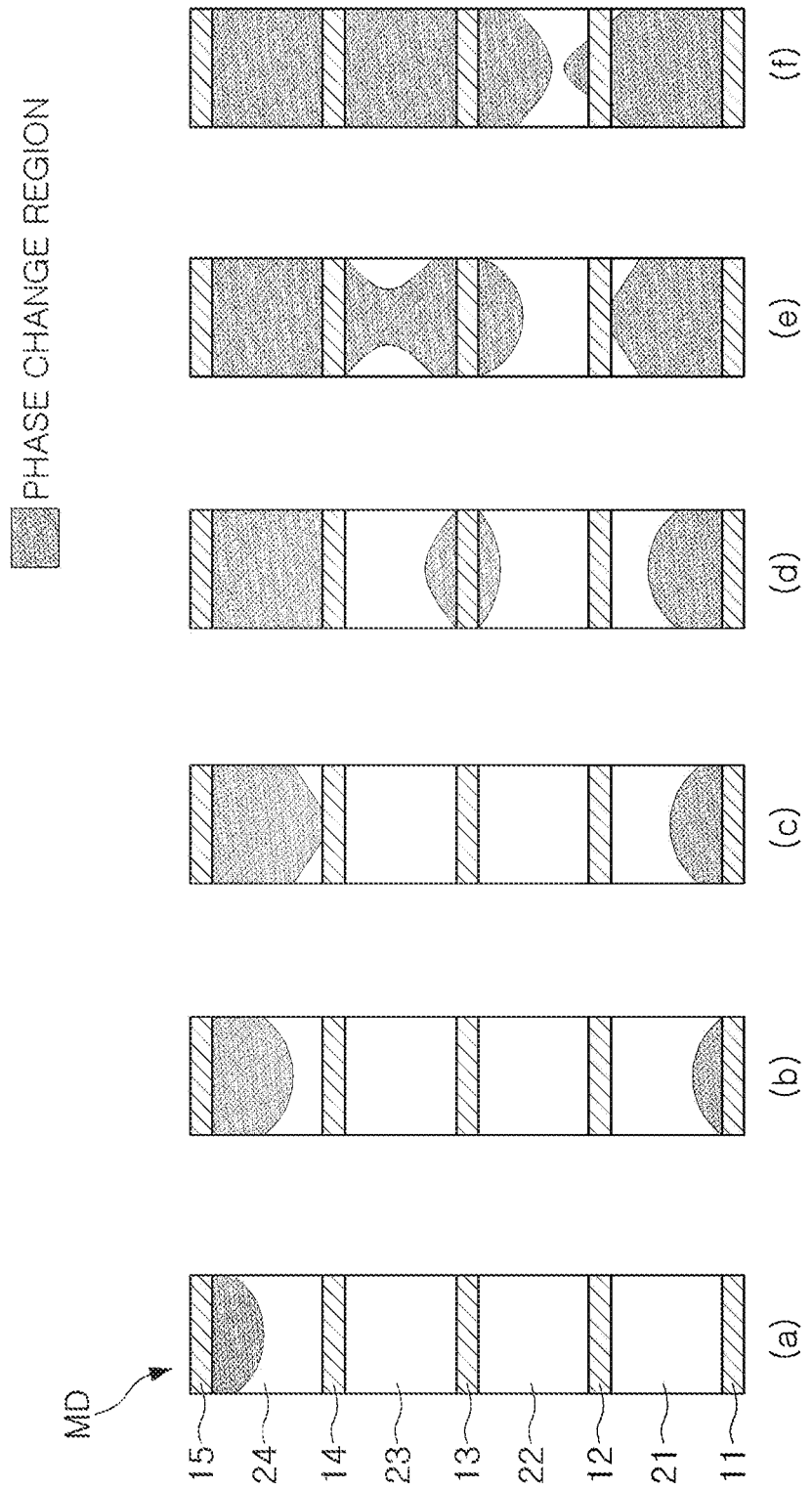
FIGS. 9 and 10 are views illustrating simulation results of a semiconductor device according to example embodiments.
Figure 10:
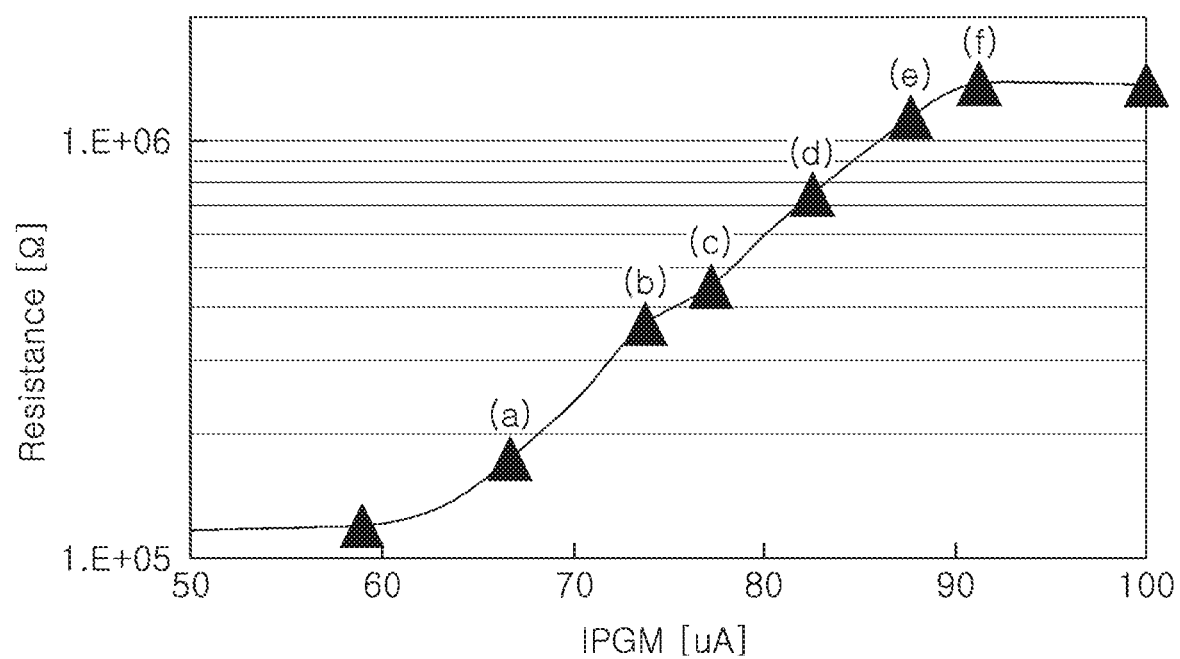

FIGS. 9 and 10 illustrate simulation results for a semiconductor device according to an example embodiment.

FIG. 9 illustrates a result of simulating a phase change according to application of a program current IPGM with respect to the data storage structure MD of FIG. 2. FIG. 10 illustrates a result of simulating a resistance change according to the application of the program current IPGM with respect to the data storage structure MD of FIG. 2.

Referring to FIGS. 9 and 10, when a first current of 66 µA is applied, the fifth electrode 15 having a highest specific resistivity may first be heated, a portion of the fourth data storage pattern 24 may be changed in phase, and the resistance of the data storage structure MD may be increased (operation (a)). Next, when a second current of 73 µA is applied, a phase change region of the fourth data storage pattern 24 may be extended, the first electrode 11 having a second highest specific resistivity may be heated, a portion of the first data storage pattern 21 may be changed in phase, and resistance of the data storage structure MD may further be increased (operation (b)). Next, when a third current of 77 µA is applied, phase change regions of the fourth data storage pattern 24 and the first data storage pattern 21 may be further extended, and resistance of the data storage structure MD may further be increased (operation (c)). Next, when a fourth current of 82 µA is applied, the entire region of the fourth data storage pattern 24 may be changed in phase, the phase change region of the first data storage pattern 21 may be further extended, the third electrode 13 having a third highest specific resistivity may be heated, and portions of regions of the third data storage pattern 23 and the second data storage pattern 22 may also begin with a change in phase. Resistance of the data storage structure MD may further be increased (operation (d)). Next, when a fifth current of 87 µA is applied, a phase change region of the first data storage pattern 21 may be further extended, the fourth electrode 14 having a fourth highest specific resistivity may be heated and an upper region of the third data storage pattern 23 may thus be additionally phase-changed. The resistance of the data storage structure MD may further be increased (operation (e)). Next, when a sixth current of 91 µA is applied, the entire region of the third data storage pattern 23 and most of the first data storage pattern 21 may be phase-changed and the second 12 having a fifth highest specific resistivity may be heated so that a lower region of the second data storage pattern 22 is further be phase-changed. The resistance of the data storage structure MD may further be increased (operation (f)).

As described above, by disposing a plurality of electrodes (heaters) having different specific resistivities between data storage patterns in a specific order, semiconductor devices according to the above embodiments may implement stable multilevel cells.

As set forth above, according to embodiments, by disposing a plurality of electrodes (heaters) having different specific resistivities between data storage patterns in a specific order, a semiconductor device in which a multilevel cell may be easily implemented and the degree of integration may be improved may be provided.

While various embodiments have been shown and described above, it will be apparent to those skilled in the art that modifications and variations could be made without departing from the scope of the present inventive concept as defined by the appended claims.

What is claimed is:

1. A semiconductor device comprising:
    a first conductive line disposed on a substrate and extending in a first direction;
    a second conductive line disposed on the first conductive line and extending in a second direction;
    a first data storage structure disposed between the first conductive line and the second conductive line; and
    a first selector structure disposed between the first conductive line and the second conductive line and connected to the first data storage structure in series,
    wherein the first selector structure comprises a first lower selective electrode, a first selector layer, and a first upper selective electrode,
    wherein the first data storage structure comprises a first electrode, a first data storage pattern, a second electrode, a second data storage pattern, a third electrode, a third data storage pattern, a fourth electrode, a fourth data storage pattern, and a fifth electrode, stacked sequentially, and
    wherein the first electrode, the second electrode, the third electrode, the fourth electrode, and the fifth electrode have different specific resistivities.

2. The semiconductor device of claim 1, wherein the first electrode has a first specific resistivity, the second electrode has a second specific resistivity, the third electrode has a third specific resistivity, the fourth electrode has a fourth specific resistivity, and the fifth electrode has a fifth specific resistivity, and among the first to fifth specific resistivities, the fifth specific resistivity is highest and the second specific resistivity is lowest.

3. The semiconductor device of claim 2, wherein the first specific resistivity is lower than the fifth specific resistivity, and is higher than the third specific resistivity, and
wherein the fourth specific resistivity is lower than the third specific resistivity and is higher than the second specific resistivity.

4. The semiconductor device of claim 1, wherein the first electrode has a first specific resistivity, the second electrode has a second specific resistivity, the third electrode has a third specific resistivity, the fourth electrode has a fourth specific resistivity, and the fifth electrode has a fifth specific resistivity, and among the first to fifth specific resistivities, the first specific resistivity is highest and the fourth specific resistivity is lowest.

5. The semiconductor device of claim 4, wherein the fifth specific resistivity is lower than the first specific resistivity, and is higher than the third specific resistivity, and
the second specific resistivity is lower than the third specific resistivity and is higher than the fourth specific resistivity.

6. The semiconductor device of claim 1, wherein the first electrode, the second electrode, the third electrode, the fourth electrode, and the fifth electrode comprise titanium silicon nitride (TiSiN) including different silicon (Si) contents.

7. The semiconductor device of claim 6, wherein the first electrode comprises a first silicon content, the second electrode comprises a second silicon content, the third electrode comprises a third silicon content, the fourth electrode comprises a fourth silicon content, and the fifth electrode comprises a fifth silicon content,
among the first to fifth silicon contents, the fifth silicon content is greatest and the second silicon content is lowest,
the first silicon content is lower than the fifth silicon content and is greater than the third silicon content, and
the fourth silicon content is lower than the third silicon content and is greater than the second silicon content.

8. The semiconductor device of claim 6, wherein the first electrode comprises a first silicon content, the second electrode comprises a second silicon content, the third electrode comprises a third silicon content, the fourth electrode comprises a fourth silicon content, and the fifth electrode comprises a fifth silicon content,
among the first to fifth silicon contents, the first silicon content is greatest and the fourth silicon content is lowest,
the fifth silicon content is lower than the first silicon content and is greater than the third silicon content, and
the second silicon content is lower than the third silicon content and is greater than the fourth silicon content.

9. The semiconductor device of claim 1, wherein a side surface of the first electrode, a side surface of the first data storage pattern, a side surface of the second electrode, a side surface of the second data storage pattern, a side surface of the third electrode, a side surface of the third data storage pattern, a side surface of the fourth electrode, a side surface of the fourth data storage pattern, and a side surface of the fifth electrode are coplanar with one another.

10. The semiconductor device of claim 1, wherein a side surface of the first electrode, a side surface of the second electrode, a side surface of the third electrode, a side surface of the fourth electrode and a side surface of the fifth electrode protrude further than a side surface of the first data storage pattern, a side surface of the second data storage pattern, a side surface of the third data storage pattern, and a side surface of the fourth data storage pattern.

11. The semiconductor device of claim 1, wherein the first data storage pattern, the second data storage pattern, the third data storage pattern, and the fourth data storage pattern are formed of a variable resistance material having the same composition.

12. A semiconductor device comprising:
a first conductive line disposed on a substrate and extending in a first direction;
a second conductive line disposed on the first conductive line and extending in a second direction;
a first data storage structure disposed between the first conductive line and the second conductive line;
a third conductive line disposed on the second conductive line and extending in the first direction; and
a second data storage structure disposed between the second conductive line and the third conductive line,
wherein the first data storage structure comprises a first electrode, a first data storage pattern, a second electrode, a second data storage pattern, a third electrode, a third data storage pattern, a fourth electrode, a fourth data storage pattern, and a fifth electrode, stacked sequentially,
wherein the first electrode, the second electrode, the third electrode, the fourth electrode, and the fifth electrode have different specific resistivities,
wherein the second data storage structure comprises a sixth electrode, a sixth data storage pattern, a seventh electrode, a seventh data storage pattern, an eighth electrode, an eighth data storage pattern, a ninth electrode, a ninth data storage pattern and a tenth electrode disposed sequentially, and
wherein the sixth electrode, the seventh electrode, the eighth electrode, the ninth electrode, and the tenth electrode have different specific resistivities.

13. The semiconductor device of claim 12, further comprising a second selector structure disposed between the second conductive line and the third conductive line and connected to the second data storage structure in series,
wherein the second selector structure is a threshold switching device.

* * * * *